United States Patent
Hsiung et al.

(10) Patent No.: US 6,890,851 B2
(45) Date of Patent: May 10, 2005

(54) INTERCONNECTION STRUCTURE AND FABRICATION METHOD THEREOF

(75) Inventors: Chiung-Sheng Hsiung, Hsinchu (TW); Chih-Chao Yang, Hsinchu (TW); Gwo-Shil Yang, Hsinchu (TW); Ming-Shih Yeh, Changhua Hsien (TW); Jen-Kon Chen, Hsinchu (TW)

(73) Assignee: United Microelectronics Corp., Hisnchu (TW)

( * ) Notice: Subject to any disclaimer, the term of this patent is extended or adjusted under 35 U.S.C. 154(b) by 0 days.

(21) Appl. No.: 10/449,262

(22) Filed: May 29, 2003

(65) Prior Publication Data
US 2004/0241978 A1 Dec. 2, 2004

(51) Int. Cl.⁷ .......................................... H01L 21/4763
(52) U.S. Cl. ........................ 438/637; 438/642; 438/622
(58) Field of Search ........................................ 438/616

(56) References Cited

U.S. PATENT DOCUMENTS 6,100,184 A * 8/2000 Zhao et al. ................. 438/638
6,309,801 B1 * 10/2001 Meijer et al. ............... 430/313
6,372,653 B1 * 4/2002 Lou et al. .................... 438/706
6,451,683 B1 * 9/2002 Farrar ......................... 438/622
6,509,258 B2 * 1/2003 Farrar ......................... 438/622
6,521,524 B1 * 2/2003 Wang et al. ................. 438/637
6,528,428 B1 * 3/2003 Chen et al. .................. 438/700

* cited by examiner

Primary Examiner—David Nelms
Assistant Examiner—Thao P. Le
(74) Attorney, Agent, or Firm—J.C. Patents

(57) ABSTRACT

An interconnection structure and a fabrication method thereof. A first organic low-k material layer, a stress redistribution layer, a second organic low-k dielectric layer are formed in sequence over a substrate, followed by forming an opening in the first organic low-k material layer, the stress redistribution layer, and the second organic low-k dielectric layer. The opening is then filled with a conductive material to form an interconnection structure. The stress redistribution layer has a heat expansion coefficient closer to that of the substrate, while such heat expansion coefficient differs more significantly from those of the first and second organic low-k material layers.

12 Claims, 1 Drawing Sheet

INTERCONNECTION STRUCTURE AND FABRICATION METHOD THEREOF

BACKGROUND OF THE INVENTION

1. Field of the Invention

The invention relates to a semiconductor device and a fabrication method thereof. More particularly, the invention relates to an interconnection structure and a fabrication method thereof, which are characterized by an ability to reduce stress.

2. Description of the Related Art

As the line width of the semiconductor device keeps reducing to achieve a higher integration, the resistance of the interconnection in the device becomes higher, and a parasitic capacitance that occurs between the conductive lines also becomes more significant. This would reduce the operation speed of the device due to the well-known RC delay. So, Copper (Cu) with a low resistance, as well as low dielectric constant (low-k) materials having a dielectric constant lower than that of silicon oxide become necessary choices of materials in the manufacture process. And among different low-k materials, organic low-k material is one type that is most commonly known.

However, since the organic low-k material has characteristics that differ significantly from those of the inorganic materials commonly adopted in the device. For instance, the heat expansion coefficient of the organic low-k material is several times larger than the inorganic material. So, large amount of stress is often produced due to the temperature variation. For example, during the in-line process, thermal cycling, or stress migration test that requires a high temperature and long duration, the via that forms in the organic low-k material layer is often deformed due to a very large stress. And when the via is deformed, it is possible to cause degradation of the via resistance (i.e. increased resistance), and even to create an open circuit.

FIG. 1 is a schematic diagram illustrating a conventional dual damascene structure having a via therein. As shown in FIG. 1, a substrate 100 is provided with a copper layer 110 already formed therein. A cap layer 120 made of silicon nitride and an organic low-k material layer 130 are formed in sequence on the substrate 100. The organic low-k material layer 130 has therein a via opening 140 that penetrates the cap layer 120 and a trench 150 above the via opening 140. Furthermore, a diffusion barrier layer 160 that serves to prevent diffusion of the metal atoms is formed to cover a surface of the via opening 140 and the trench 150. The via opening 140 and the trench 150 are then filled with a metal to form a via 170 and a conductive line 180.

Referring to table 1 provided below, illustrating stress results obtained from simulating the dual damascene structure according to one preferred embodiment using commercial software "Tsupreme". Referring to FIG. 1, a direction that is parallel to a surface of the substrate 100 is set to be x direction, while a direction that is vertical to the surface of the substrate 100 is set to be y direction. And a stress from x direction $S_{xx}$, a stress from y direction $S_{yy}$, and a shearing stress from xy plane $S_{xy}$ are simulated results to be obtained. Except of three variations in the sidewall tilted angles θ of the via opening 140, parameters for the other parts of the dual damascene structure are similar to those in the prior art.

As shown in the simulated results, the stresses mainly accumulate at a junction 190 (circled by a dotted line) between the organic low-k material layer 130 and a portion of the capping layer adjacent to the via 170.

TABLE 1

| Tilted angle of sidewall θ | Stress (J/cm$^2$) | | |
|---|---|---|---|
| | $S_{yy}$ | $S_{xx}$ | $S_{xy}$ |
| 88 | 55.4 | 52.8 | 38.3 |
| 80 | 61.5 | 44.1 | 31.3 |
| 75 | 61.3 | 32.1 | 23.5 |

As shown in table 1, the via 170 is subjected mainly to the stresses $S_{xx}$ and $S_{yy}$ from x and y directions, particularly the stress $S_{yy}$, while the shearing stress $S_{xy}$ is the minimal. On the other hand, after inspecting a batch of the failed devices, it is found that there are many damaged via as well as occurrence of delamination at a junction between the diffusion barrier layer 160-copper layer 110 caused by an oversized stress $S_{yy}$. The damaged via would make the device ineffective, while the delamination that occurs between the diffusion barrier layer 160-copper layer 110 would cause a high leakage current.

So, in order to solve the problem of degrading the via when subjected to a thermal process, the stress $S_{yy}$ needs to be reduced without increasing the stresses from other directions for preventing other problems to occur. However, as seen in the simulated results in table 1, the stress $S_{xx}$ varies inversely with the stress $S_{yy}$ in the prior art. That is, as the tilted angle θ increases, the stress $S_{yy}$ may be reduced slightly, but the stress $S_{xx}$ would be increased significantly. Thus, to prevent other problems caused by an oversized stress $S_{xx}$, the room for adjusting the stress $S_{yy}$ becomes limited.

SUMMARY OF THE INVENTION

The invention provides an interconnection structure having a reduced stress and a fabrication method thereof, so as to prevent damaging a via or conductive line that lead to an increase in resistance or leakage current.

The interconnection structure comprises of a first organic low-k material layer formed on a substrate, a stress redistribution layer formed on the first organic low-k material layer, a second organic low-k material layer formed on the stress redistribution layer, and an interconnection formed in the first organic low-k material layer, the stress redistribution layer, and the second organic low-k material layer. The interconnection can serve as a via, a conductive line, or a dual damascene made of the via and the conductive line. Also, the stress redistribution layer has a heat expansion coefficient closer to that of the substrate, while such heat expansion coefficient differs more significantly from those of the first and second organic low-k material layers.

Furthermore, in the interconnection structure described above, the stress redistribution layer can form in between a top portion and bottom portion of the via, or form in between a top portion and bottom portion of the conductive line when the interconnection is a dual damascene.

On the other hand, the invention provides a method of fabricating the interconnection structure. A first organic low-k material layer, a stress redistribution layer, a second organic low-k dielectric layer are formed in sequence over a substrate, followed by forming an opening in the first organic low-k material layer, the stress redistribution layer, and the second organic low-k dielectric layer. The opening can be a via opening, a trench, or a dual damascene opening.

The opening is then filled with a conductive material to form an interconnection structure. Also, the stress redistribution layer has a heat expansion coefficient closer to that of the substrate, while such heat expansion coefficient differs more significantly from those of the first and second organic low-k material layers.

According to the invention described above, the stress redistribution layer having a characteristic similar to the substrate is sandwiched between the organic low-k material layers. Hence, the two organic low-k material layers can be made thinner than the conventional organic low-k material layer. The stress redistribution layer can scatter the stress produced from the organic low-k material layers, so that the stress that accumulate at a junction underneath the organic low-k material layers is reduced and redistributed to elsewhere. Therefore, the interconnection structure as described in the invention would not cause a rise in resistance of the via, as well as a damage of the via. In addition, delamination would not occur easily at a junction between a diffusion barrier layer and a copper layer, thus minimizing chances of short-circuiting between conductive lines of different metallization levels.

Both the foregoing general description and the following detailed description are exemplary and explanatory only and are not restrictive of the invention, as claimed.

DESCRIPTION OF THE PREFERRED EMBODIMENTS

Figure 1:
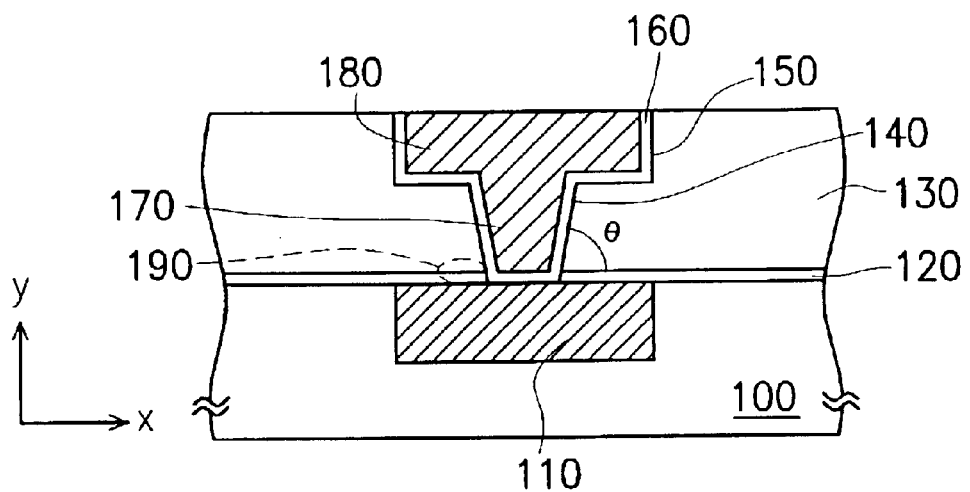
FIG. 1 is a schematic diagram illustrating a conventional dual damascene structure having a via therein.
Figure 2:
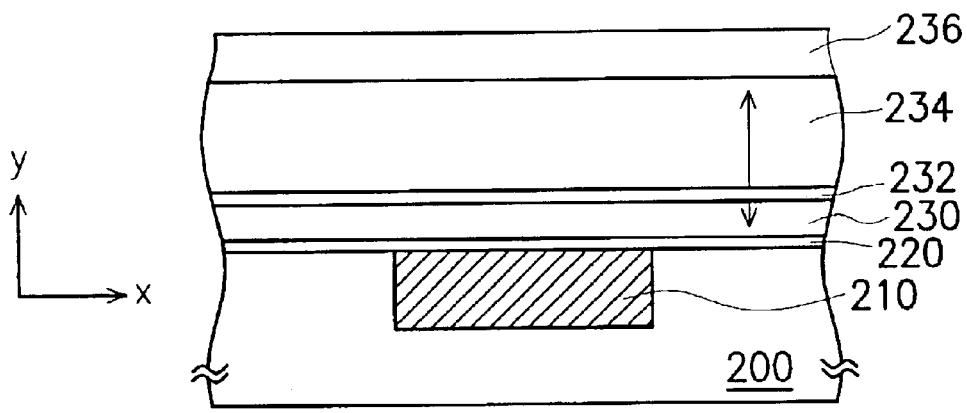
FIGS. 2–3 are schematic diagrams illustrating the method of fabricating the dual damascene interconnection structure according to one preferred embodiment of the present invention, wherein FIG. 3 also illustrates the dual damascene interconnection structure according to one preferred embodiment of the present invention.
Figure 3:
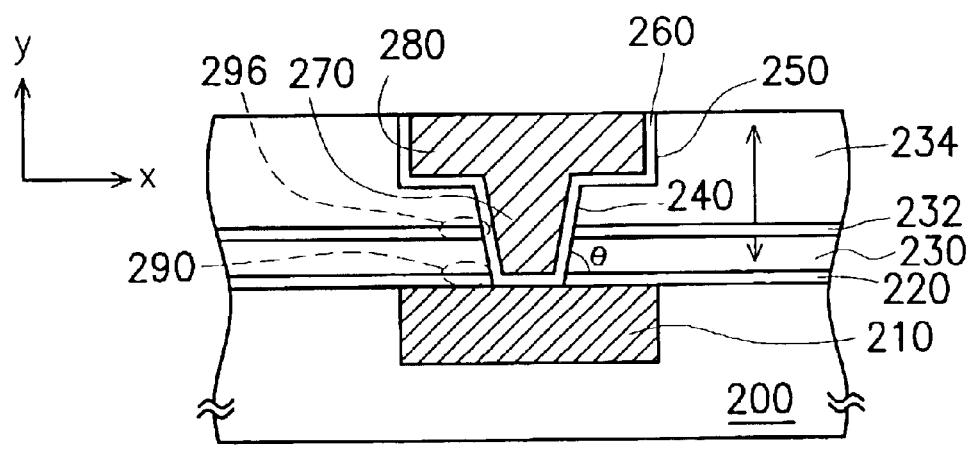

FIGS. 2–3 are schematic diagrams illustrating the method of fabricating the dual damascene interconnection structure according to one preferred embodiment of the present invention, wherein FIG. 3 also illustrates the dual damascene interconnection structure according to one preferred embodiment of the present invention.

Referring to FIG. 2, a substrate 200 is provided, wherein the substrate 200 has a metal layer 210, such as a copper layer already formed therein. Also, a cap layer 220 made of material, such as silicon nitride is already formed over the substrate 200. Next, an organic low dielectric constant (low-k) material layer 230 is formed over the substrate. The organic low-k material layer 230 may be made of a material such as polyimide, fluorinated polyimide, poly(arylene ether), parylene, polytetrafluoroethylene (PTFE), and benzocyclobutene (BCB).

Still referring to FIG. 2, a stress redistribution layer 232 is formed on the organic low-k material layer 230. The stress redistribution layer 232 has a heat expansion coefficient closer to that of the substrate. In other words, the stress redistribution layer 232 is much more similar in terms of its characteristics to that of inorganic material. However, the heat expansion coefficient of the stress redistribution layer 232 differs more significantly from those of the organic low-k material layer 230. The stress redistribution layer 232 may be made of material, such as silicon nitride, Blok™ with its main ingredient being silicon carbide (SiC), silicon hydroxyl carbide (SiCOH), spin-on glass (SOG), or hydrido organo siloxane polymer (HOSP). An organic low-k material layer 234 is then formed on the stress redistribution layer 232, wherein the organic low-k material layer 234 is made of the same material for making the organic low-k material layer 230.

Referring to FIG. 3, a via opening 240 and a trench 250 above the via opening 240, together known as a dual damascene opening, are formed in the organic low-k material layer 234, the stress redistribution layer 232, and the organic low-k material layer 230. The via opening 240 penetrates a bottom layer of the organic low-k material layer 234, the stress redistribution layer 232, the organic low-k material layer 230, and the cap layer 220 to expose a part of the metal layer 210. The trench 250 is formed on a top layer of the organic low-k material layer 234. Next, a barrier layer 260 is formed over a surface of the via opening 240 and trench 250. The barrier layer 260 may be made of a material such as titanium nitride. The via opening 240 and the trench 250 are filled with a metal, such as copper to form a via 270 and a conductive line 280.

Referring to table 2 provided below, illustrating stress results obtained from simulating the dual damascene structure according to one preferred embodiment using commercial software "Tsupreme". The results from the prior art are also included in<>to provide a comparison. Alternatively, there can be three variations of tilted angle θ provided for the sidewall of the via opening 240, as well as simulation parameter settings that are generally the same as those used in the prior art, except providing one extra stress redistribution layer 232 and dividing the organic low-k material layer according to the proportions illustrated in both FIGS. 2 and 3 into two layers 230 and 234.

As shown in the simulating results, mainly accumulate at a junction 290 between the organic low-k material layer 230 and a portion of the cap layer adjacent to the via 270, as well as adhering portions 296 where the organic low-k material layers 230 and 234 adhere to the stress redistribution layer 232. But, after comparing with the result in the prior art, it is apparent that the stress at the junction 290 with the largest initial stress is lower than that in the prior art, since it is distribute to the adhering portions 296 where the organic low-k material layers 230 and 234 adhere to the stress redistribution layer 232.

TABLE 2

| Tilted angle of sidewall θ | Stress (J/cm²) | | |
| --- | --- | --- | --- |
| | $S_{yy}$ | $S_{xx}$ | $S_{xy}$ |
| 88 | 46.6 <55.4> | 55.8 <52.8> | 36.5 <38.3> |
| 80 | 42 <61.5> | 43.7 <44.1> | 23.7 <31.3> |
| 75 | 41 <61.3> | 42.8 <32.1> | 18.8 <23.5> |

As shown in table 2, by comparing with results from the prior art, the stress $S_{yy}$ at y direction and stress $S_{xy}$ at x direction according to the via structure of the present embodiment are both found to be reduced. Particularly, when the tilted angle θ of the sidewall of the via opening 240 becomes smaller, $S_{yy}$ is reduced most, by approximately 30% (61.3→41).

Further shown in FIG. 2, the stresses $S_{yy}$, $S_{xx}$, and $S_{xy}$ all show the same variation trend. That is, when the tilted angle θ of the sidewall of the via opening 240 is reduced, the stresses $S_{yy}$, $S_{xx}$, and $S_{xy}$ are all reduced, with the stress $S_{xy}$ being the most significant. Thus, the stresses $S_{yy}$, $S_{xx}$, and $S_{xy}$ all have larger rooms for adjustment than those of the prior art, especially the stress $S_{xy}$.

Moreover, referring to both FIGS. 2 and 3, the location of the stress redistribution layer 232 between the organic low-k material layers 230 and 234 can be adjusted as shown by the arrows in the diagram. That is, the organic low-k material layer 230 can be made thinner or thicker, while the organic low-k material layer 234 can correspondingly made thicker or thinner. In other words, the stress redistribution layer 232 can be located between a bottom portion and top portion of the via opening 240, or located between a bottom portion and top portion of the trench 250.

Summarizing from the above, the organic low-k material layers 230 and 234 is separated by the stress redistribution layer 232, so that both the organic low-k material layers 230 and 234 are made thinner than those used in the prior art. Thus, by comparing with the prior art, the stress resulted from the organic low-k material layers can be scattered in the present invention. This reduces the stress that accumulates at the junction 190 between the organic low-k material layer 130 and the cap layer 120, and redistributes the stress to elsewhere.

In addition, as seen in table 2, the stress $S_{yy}$ at y direction and stress $S_{xy}$ at x direction according to the dual damascene interconnection structure of the present embodiment are both found to be lower than those of the prior art. And since the stresses $S_{yy}$, $S_{xx}$, and $S_{xy}$ show the same variation trend that corresponds to the tilted angle θ of the sidewall of the via opening 240, all of them have larger rooms for adjustment.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An interconnection structure, comprising:
    a first organic low-k material layer formed over a substrate;
    a stress redistribution layer formed on the first organic low-k material layer, wherein the stress redistribution layer is selected from the group consisting of silicon carbide (SiC), silicon hydroxyl carbide (SiCOH), spin-on glass (SOG), hydrido organo siloxane polymer (HOSP) and a combination thereof;
    a second organic low-k material layer formed on the stress redistribution layer; and
    an interconnection formed in the first organic low-k material layer, the stress redistribution layer, and the second organic low-k material layer.

2. The interconnection structure according to claim 1, wherein the interconnection includes a via.

3. The interconnection structure according to claim 1, wherein the interconnection includes a conductive line.

4. The interconnection structure according to claim 1, wherein the interconnection includes a dual damascene comprising a via and a conductive line formed above the via.

5. The interconnection structure according to claim 4, wherein the stress redistribution layer is formed in between a top portion and bottom portion of the via.

6. The interconnection structure according to claim 4, wherein the stress redistribution layer is formed in between a top portion and bottom portion of the conductive line.

7. The interconnection structure according to claim 1, wherein the first and second organic low-k material layers arc made of the same material.

8. The interconnection structure according to claim 1, wherein the first and second organic low-k material layers are made of a material selected from a group consisting of polyimide, fluorinated polyimide, poly(arylene ether), parylene, polytetrafluoroethylene (PTFE), and beuzocyclobutene (BCB).

9. The interconnection structure according to claim 1, further comprising a cap layer formed in between the first organic low-k material layer and the substrate.

10. The interconnection structure according to claim 9, wherein the cap layer includes a silicon nitride layer.

11. The interconnection structure according to claim 1, further comprising a diffusion barrier layer formed between the interconnection and device layers including the substrate, the first organic low-k material layer, the stress redistribution layer, and the second organic low-k material layer.

12. The interconnection structure according to claim 11, wherein the diffusion barrier layer includes a titanium nitride layer.

* * * * *